United States Patent
Suzuki

(10) Patent No.: US 8,338,821 B2
(45) Date of Patent: Dec. 25, 2012

(54) PRESSURE DETECTION APPARATUS, JOSEPHSON DEVICE, AND SUPERCONDUCTING QUANTUM INTERFERENCE DEVICE THAT INCLUDE SUPERCONDUCTOR THIN FILM THAT UNDERGOES TRANSITION FROM SUPERCONDUCTOR TO INSULATOR BY PRESSURE

(75) Inventor: Takashi Suzuki, Higashihiroshima (JP)

(73) Assignee: Hiroshima University, Higashihiroshima-shi, Hiroshima (JP)

( * ) Notice: Subject to any disclaimer, the term of this patent is extended or adjusted under 35 U.S.C. 154(b) by 266 days.

(21) Appl. No.: 12/601,790

(22) PCT Filed: Jul. 31, 2008

(86) PCT No.: PCT/JP2008/002069
§ 371 (c)(1),
(2), (4) Date: Nov. 24, 2009

(87) PCT Pub. No.: WO2010/013294
PCT Pub. Date: Feb. 4, 2010

(65) Prior Publication Data
US 2010/0171098 A1    Jul. 8, 2010

(51) Int. Cl.
*H01L 39/22* (2006.01)
(52) U.S. Cl. ............ 257/31; 257/E39.003; 257/E39.012; 257/E39.014; 327/366; 327/367
(58) Field of Classification Search ............ 257/31, 257/34, 35, 36, E39.003, E39.012, E39.014; 327/366, 367
See application file for complete search history.

(56) References Cited

U.S. PATENT DOCUMENTS 6,109,113 A * 8/2000 Chavan et al. ............ 73/718

FOREIGN PATENT DOCUMENTS

| JP | 63-232381 | | 9/1988 |
|----|-----------|---|--------|
| JP | 63-263781 | | 10/1988 |
| JP | 01-091480 | | 4/1989 |
| JP | 64-090573 | | 4/1989 |
| JP | 02-260474 | | 10/1990 |
| JP | 03-041332 | | 2/1991 |
| JP | 06-005934 | | 1/1994 |
| JP | 07-235700 | | 9/1995 |
| JP | 2000004052 A * | 1/2000 |

(Continued)

OTHER PUBLICATIONS

Ito, M. et al., "Transport properties of the spinel superconductor $CuRh_2S_4$ under pressure," *Journal of Applied Physics*, 97, 2005, pp. 10B112-1-10B112-3.

(Continued)

*Primary Examiner* — Eduardo A Rodela
(74) *Attorney, Agent, or Firm* — Foley & Lardner LLP

(57) ABSTRACT

A pressure detection apparatus (30) detects, among a plurality of superconductor thin films (11 to 14) having different critical pressures at which a transition from a superconductor to an insulator occurs, the superconductor thin films (12 to 14) that have undergone the transition to the insulator with ammeters (242, 252, 262); and to detect, as an internal pressure of a housing (10), the maximum critical pressure among the critical pressures of the detected superconductor thin films (12 to 14).

9 Claims, 3 Drawing Sheets

FOREIGN PATENT DOCUMENTS

| JP | 2000-351632 | 12/2000 |
|---|---|---|
| JP | 2008-047852 | 2/2008 |

OTHER PUBLICATIONS

Japanese Office Action, dated Nov. 17, 2009, issued in corresponding Japanese Patent Application No. 2009-213934.

International Search Report and Written Opinion of the International Searching Authority for Intl. Pat. Appln. No. PCT/JP2008/002069, mailed on Nov. 11, 2008, 10 pp.

ITO, M. et al., "Pressure Induced Superconductor-Insulator Transition in the Spinel Compound $CuRh_2S_4$,"*Physical Review Letters*, (week ending Aug. 15, 2003), vol. 91, No. 17, pp. 077001-1-077001-4, The American Physical Society.

Nagata, T. et al., "Pressure-Induced Dimensional Crossover and Superconductivity in the Hole-Doped Two-Leg Ladder Compound $Sr_{14-x}Ca_xCu_{24}O_{41}$,"*Physical Review Letters*, (1998), vol. 81, No. 5, pp. 1090-1093, The American Physical Society.

Wang, J.J. et al., "Magnetic levitation force between a superconducting bulk magnet and a permanent magnet," *Superconductor Science and Technology*, (2003), vol. 16, No. 4, pp. 527-533, Institute of Physics Publishing.

\* cited by examiner

PRESSURE DETECTION APPARATUS, JOSEPHSON DEVICE, AND SUPERCONDUCTING QUANTUM INTERFERENCE DEVICE THAT INCLUDE SUPERCONDUCTOR THIN FILM THAT UNDERGOES TRANSITION FROM SUPERCONDUCTOR TO INSULATOR BY PRESSURE

CROSS-REFERENCE TO RELATED APPLICATIONS

The present application is a U.S. national stage application claiming the benefit of International Application No. PCT/JP2008/002069, filed on Jul. 31, 2008, the entire contents of which is incorporated herein by reference in its entirety.

TECHNICAL FIELD

The present invention relates to a pressure detection apparatus, a Josephson device, and a superconducting quantum interference device that include a superconductor thin film that undergoes a transition from a superconductor to an insulator by pressure.

BACKGROUND ART

A Josephson device including two superconductors is known (Japanese Unexamined Patent Application Publication No. 63-263781).

This Josephson device has a configuration in which two ceramic superconductors are joined to each other with a cleavage plane therebetween. A pressure is applied to the cleavage plane such that the two ceramic superconductors are not separated from each other.

DISCLOSURE OF INVENTION

However, since conventional Josephson devices need to undergo a transition from the superconducting state to the normal conducting state by controlling the temperature, it is difficult to cause a transition from a superconductor to an insulator while the temperature is kept constant.

Accordingly, there is a desire for a pressure detection apparatus that includes a superconductor that undergoes a transition from the superconductor to an insulator while the temperature is kept constant.

There is also a desire for a Josephson device that includes a superconductor that undergoes a transition from the superconductor to an insulator while the temperature is kept constant.

Furthermore, there is a desire for a superconducting quantum interference device that includes a superconductor that undergoes a transition from the superconductor to an insulator while the temperature is kept constant.

The pressure detection apparatus includes a housing, a plurality of thin films, and a detection device. The housing is kept at an absolute temperature of 10 K or less. The plurality of superconductor thin films are disposed in the housing and have different critical pressures at which a transition from a superconductor to an insulator occurs. The detection device detects, among the plurality of superconductor thin films, a superconductor thin film that has undergone the transition from the superconductor to the insulator; and detects, as an internal pressure of the housing, a maximum critical pressure in the critical pressure of the detected superconductor thin film.

The pressure detection apparatus may further include a plurality of first and second electrodes. The plurality of first electrodes are disposed so as to be associated with the plurality of superconductor thin films and are connected to one ends of the associated superconductor thin films. The plurality of second electrodes are disposed so as to be associated with the plurality of superconductor thin films and are connected to another ends of the associated superconductor thin films. The detection device detects, among the plurality of superconductor thin films, a superconductor thin film that has undergone the transition from the superconductor to the insulator by detecting current flowing between the first and second electrodes disposed at the both ends of the superconductor thin films.

The plurality of superconductor thin films may be composed of a plurality of $CuIr_2S_4$ that contain a dopant in different amounts.

The Josephson device includes a superconductor thin film and a pressure application unit. The superconductor thin film is kept at an absolute temperature of 10 K or less and composed of $CuRh_2S_4$. The pressure application unit applies a pressure of a critical pressure at which a transition from a superconductor to an insulator occurs or more to a portion of the superconductor thin film.

The pressure application unit may include a plurality of projection members and a pressing member. The pressing member presses the plurality of projection members onto the portion of the superconductor thin film.

The pressing member may include an electrostrictive element or a piezoelectric element.

The pressure application unit may include an electrostrictive element disposed so as to be in contact with the portion of the superconductor thin film.

The superconducting quantum interference device includes a superconductor thin film and first and second pressure application units. The superconductor thin film has a shape of a ring, and includes $CuRh_2S_4$ kept at an absolute temperature of 10 K or less. The first pressure application unit applies a pressure of a critical pressure at which a transition from a superconductor to an insulator occurs or more to a first portion of the superconductor thin film. The second pressure application unit applies a pressure of the critical pressure or more to a second portion of the superconductor thin film, the second portion being different from the first portion.

Each of the first and second pressure application units may include a plurality of projection members and a pressing member. The pressing member presses the plurality of projection members onto the portion of the superconductor thin film.

The pressure detection apparatus detects a superconductor thin film that has undergone the transition from the superconductor to the insulator by the application of a pressure of the critical pressure or more, and detects, as the internal pressure of the housing, the maximum critical pressure in the critical pressure of the detected superconductor thin film.

Therefore, pressure can be detected with superconductor thin films that undergo a transition from a superconductor to an insulator depending on a pressure applied to the superconductor thin films while the temperature is kept constant.

The Josephson device is produced by applying a pressure of the critical pressure or more to the portion of the superconductor thin film to thereby cause the transition of the portion of the superconductor thin film to an insulator layer.

Therefore, the Josephson device can be produced by changing the magnitude of a pressure applied to the superconductor thin film while the temperature is kept constant.

The superconducting quantum interference device is produced by applying a pressure of the critical pressure or more to the portions of the superconductor thin film to thereby cause the transition of the portions of the superconductor thin film to an insulator layer.

Therefore, the superconducting quantum interference device can be produced by changing the magnitude of a pressure applied to the superconductor thin film while the temperature is kept constant.

BEST MODES FOR CARRYING OUT THE INVENTION

Figure 1:
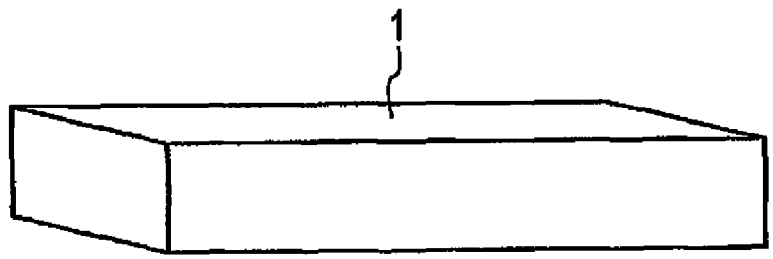
FIG. 1 is a perspective view of a superconductor thin film used in an embodiment of the present invention.

Embodiments of the present invention will be described in detail with reference to the drawings. Note that the same or similar elements in the drawings are designated with identical reference numerals and descriptions of such elements are not repeated.

FIG. 1 is a perspective view of a superconductor thin film used in an embodiment of the present invention. Referring to FIG. 1, a superconductor thin film 1 has the shape of a generally rectangular parallelepiped and is composed of $CuRh_2S_4$ that is a spinel compound.

This $CuRh_2S_4$ is prepared by the following manner. A 99.999% copper (Cu) powder, a 99.9% rhodium (Rh) powder, and a 99.9999% sulfur (S) powder are mixed in stoichiometric proportions.

The resultant powder mixture of the Cu, Rh, and S powders is then sealed in a quartz tube and heat treated at 850° C. for 10 days.

After that, the mixture of the Cu, Rh, and S is ground, subsequently compacted in a pellet, and sintered at 1000° C. for 3 days. As a result, the $CuRh_2S_4$ is prepared.

Figure 2:
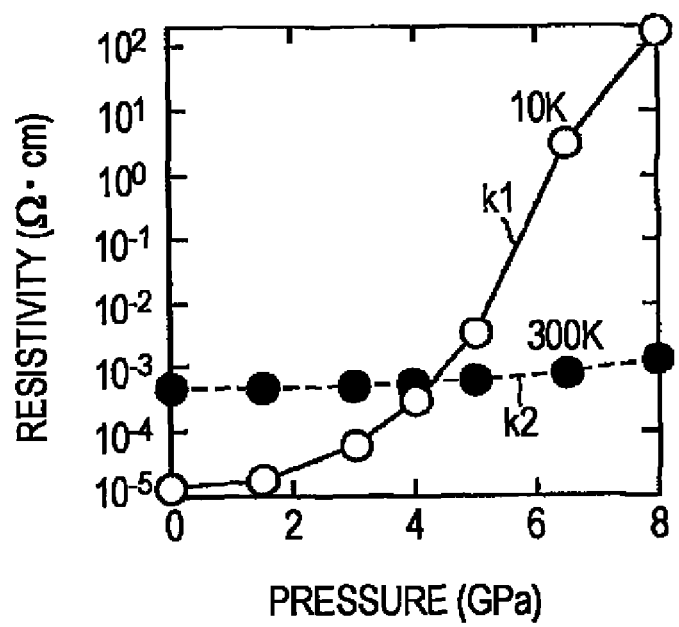
FIG. 2 is a graph showing the relationship between the resistivity of $CuRh_2S_4$ and pressure.

FIG. 2 is a graph showing the relationship between the resistivity of $CuRh_2S_4$ and pressure. In FIG. 2, the ordinate axis indicates the resistivity and the abscissa axis indicates pressure applied to $CuRh_2S_4$. The curve k1 shows the relationship between the resistivity and the pressure at an absolute temperature of 10 K. The curve k2 shows the relationship between the resistivity and the pressure at an absolute temperature of 300 K.

Referring to FIG. 2, at the absolute temperature of 300 K, even when a pressure of 8 GPa is applied to $CuRh_2S_4$, the resistivity only increases up to $1 \times 10^{-3}$ Ω·cm (see the curve k2).

In contrast, at the absolute temperature of 10 K, the resistivity of $CuRh_2S_4$ is less than $1 \times 10^{-3}$ Ω·cm when a pressure in the range of 0 to 5.3 GPa is applied to the $CuRh_2S_4$; and the resistivity of $CuRh_2S_4$ sharply increases when a pressure of 0 to 5.3 GPa or more is applied to the $CuRh_2S_4$.

In this way, $CuRh_2S_4$ becomes a superconductor at an absolute temperature of 10 K or less. At a temperature of 10 K or less, the superconducting state of $CuRh_2S_4$ is maintained when a pressure of less than 5.3 GPa is applied to $CuRh_2S_4$; and $CuRh_2S_4$ undergoes a transition from a superconductor to an insulator when a pressure of 5.3 GPa or more is applied to $CuRh_2S_4$.

The pressure of 5. GPa is a critical pressure $P_{MI}$ at which the transition from a superconductor to an insulator occurs.

Figure 3:
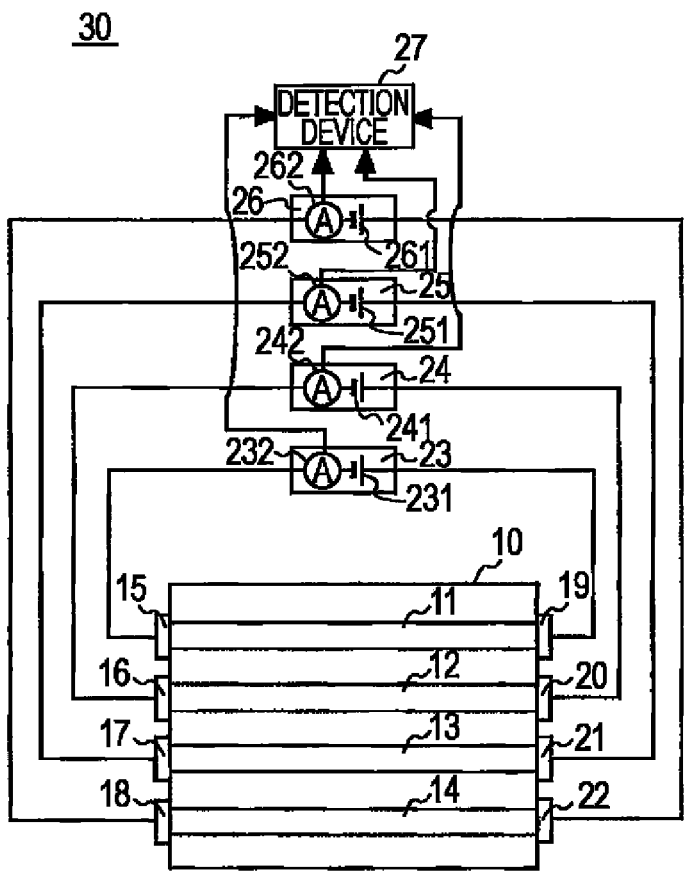
FIG. 3 is a schematic diagram of the configuration of a pressure detection apparatus according to an embodiment of the present invention.

FIG. 3 is a schematic diagram of the configuration of a pressure detection apparatus according to an embodiment of the present invention. Referring to FIG. 3, a pressure detection apparatus 30 according to an embodiment of the present invention includes a housing 10, superconductor thin films 11 to 14, electrodes 15 to 22, measurement devices 23 to 26, and a detection device 27.

The housing 10 has the shape of a generally quadrangle. The inside of the housing 10 is cooled to an absolute temperature of 10 K or less with liquid nitrogen or the like.

The superconductor thin films 11 to 14 are arranged in parallel in the housing 10. The superconductor thin film 11 is composed of $CuRh_2S_4$ or $CuIr_2S_4$ and has a critical pressure $P_{MI}1$ at which the transition from a superconductor to an insulator occurs. The superconductor thin film 12 is composed of $CuIr_2S_4$ doped with zinc (Zn) and has a critical pressure $P_{MI}2$ ($<P_{MI}1$) at which the transition from a superconductor to an insulator occurs. The superconductor thin film 13 is composed of $CuIr_2S_4$ doped with Zn in a larger amount than that in the superconductor thin film 12 and has a critical pressure $P_{MI}3$ ($<P_{MI}2$) at which the transition from a superconductor to an insulator occurs. The superconductor thin film 14 is composed of $CuIr_2S_4$ doped with Zn in a larger amount than that in the superconductor thin film 13 and has a critical pressure $P_{MI}4$ ($<P_{MI}3$) at which the transition from a superconductor to an insulator occurs.

Note that the critical pressure $P_{MI}1$ is 5.3 GPa and the critical pressure $P_{MI}4$ is 0.5 GPa.

Each of the electrodes 15 to 22 is composed of, for example, aluminum (Al). The electrodes 15 to 18 are respectively connected to one ends of the superconductor thin films 11 to 14. The electrodes 19 to 22 are respectively connected to the other ends of the superconductor thin films 11 to 14.

The measurement device 23 is connected between the electrodes 15 and 19 using lead wires. The measurement device 24 is connected between the electrodes 16 and 20 using lead wires. The measurement device 25 is connected between the electrodes 17 and 21 using lead wires. The measurement device 26 is connected between the electrodes 18 and 22 using lead wires.

The measurement device 23 includes a direct-current power supply 231 and an ammeter 232. The direct-current power supply 231 applies a direct voltage V between the electrodes 15 and 19. When the direct-current power supply 231 applies the direct voltage V between the electrodes 15 and 19, the ammeter 232 detects a current I1 flowing through the superconductor thin film 11 and outputs the detected current I1 to the detection device 27.

The measurement device 24 includes a direct-current power supply 241 and an ammeter 242. The direct-current power supply 241 applies a direct voltage V between the electrodes 16 and 20. When the direct-current power supply 241 applies the direct voltage V between the electrodes 16 and 20, the ammeter 242 detects a current I2 flowing through the superconductor thin film 12 and outputs the detected current I2 to the detection device 27.

The measurement device 25 includes a direct-current power supply 251 and an ammeter 252. The direct-current power supply 251 applies a direct voltage V between the electrodes 17 and 21. When the direct-current power supply 251 applies the direct voltage V between the electrodes 17 and 21, the ammeter 252 detects a current I3 flowing through the superconductor thin film 13 and outputs the detected current I3 to the detection device 27.

The measurement device 26 includes a direct-current power supply 261 and an ammeter 262. The direct-current power supply 261 applies a direct voltage V between the electrodes 18 and 22. When the direct-current power supply 261 applies the direct voltage V between the electrodes 18 and 22, the ammeter 262 detects a current I4 flowing through the superconductor thin film 14 and outputs the detected current I4 to the detection device 27.

The detection device 27 respectively receives the currents I1 to I4 from the ammeters 232, 242, 252, and 262. The detection device 27 contains the respective relationships between the currents I1 to I4 and the critical pressures $P_{MI}1$ to $P_{MI}4$.

When, among the currents I1 to I4, a current Ij (j represents at least one of 1 to 4) becomes "0", the detection device 27 detects, as the internal pressure of the housing 10, the maximum critical pressure in critical pressure $P_{MI}j$ corresponding to the current Ij.

For example, when the currents I2 to I4 flowing through the superconductor thin films 12 to 14 become "0", the detection device 27 detects, as the internal pressure of the housing 10, the maximum critical pressure $P_{MI}2$ among the critical pressures $P_{MI}2$ to $P_{MI}4$. When an internal pressure P of the housing 10 satisfies $P_{MI}2<P<P_{MI}1$, the superconductor thin films 12 to 14 undergo a transition from superconductors to insulators and hence the currents I2 to I4 flowing through the superconductor thin films 12 to 14, which have undergone the transition to insulators, become "0". Accordingly, the detection device 27 detects, as the internal pressure of the housing 10, the maximum critical pressure $P_{MI}2$ among the critical pressures $P_{MI}2$ to $P_{MI}4$.

That is, the detection device 27 detects, among the superconductor thin films 11 to 14, the superconductor thin films 12 to 14 that have undergone a transition from superconductors to insulators and detects, as the internal pressure of the housing 10, the maximum critical pressure $P_{MI}2$ among the critical pressures $P_{MI}2$ to $P_{MI}4$ of the detected superconductor thin films 12 to 14.

When the current I4 flowing through the superconductor thin film 14 becomes "0", the detection device 27 detects, as the internal pressure of the housing 10, the maximum critical pressure $P_{MI}4$ in the critical pressure $P_{MI}4$.

When current flowing through another superconductor thin film becomes "0", the detection device 27 similarly detects the internal pressure of the housing 10.

In this way, the pressure detection apparatus 30 detects the internal pressure of the housing 10 by using the characteristic in which the superconductor thin films 11 to 14 undergo a transition from superconductors to insulators under application of a pressure of the critical pressure $P_{MI}$ or more while the superconductor thin films 11 to 14 are kept at an absolute temperature of 10 K or less.

Therefore, the pressure detection apparatus 30 can detect the internal pressure of the housing 10 while the temperature in the housing 10 is kept at an absolute temperature of 10 K or less.

Note that the pressure detection apparatus 30 is not restricted to the case of including four superconductor thin films 11 to 14. In general, the pressure detection apparatus 30 may include a plurality of superconductor thin films.

Figure 4:
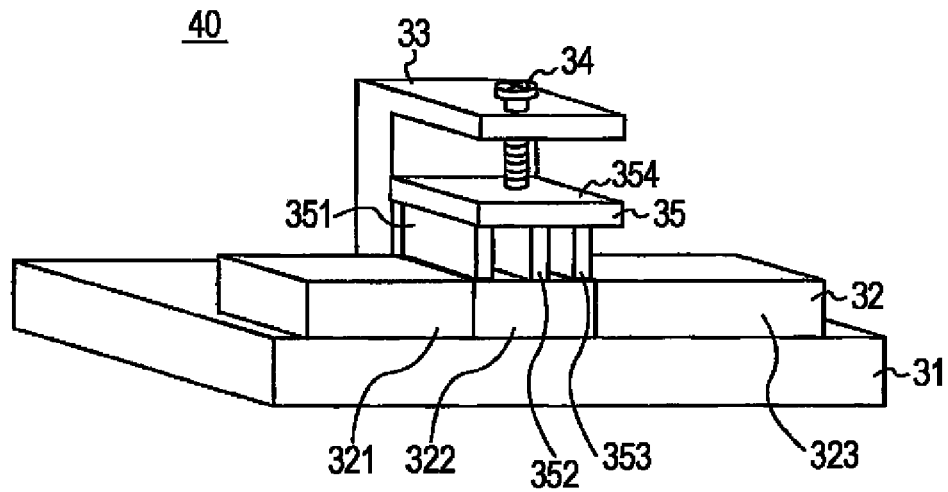
FIG. 4 is a schematic diagram of the configuration of a Josephson device according to an embodiment of the present invention.

FIG. 4 is a schematic diagram of the configuration of a Josephson device according to an embodiment of the present invention. Referring to FIG. 4, a Josephson device 40 according to an embodiment of the present invention includes a substrate 31, a superconductor thin film 32, a support member 33, a screw 34, and a pressing member 35.

The superconductor thin film 32 is cooled to an absolute temperature of 10 K or less with liquid nitrogen or the like.

The superconductor thin film 32 is composed of $CuRh_2S_4$ and has the shape of a rod. The superconductor thin film 32 is disposed on the substrate 31. The support member 33 is generally "L"-shaped. One end of the support member 33 is secured to the substrate 31. The support member 33 has, in the other end, a threaded hole (not shown) that fits the screw 34.

The screw 34 fits the threaded hole formed in the support member 33 and is rotated clockwise to thereby press the pressing member 35 onto the superconductor thin film 32.

The pressing member 35 is disposed so as to be in contact with a desired portion of the superconductor thin film 32. The pressing member 35 is pressed onto the superconductor thin film 32 by the screw 34.

The pressing member 35 includes projection members 351 to 353 and a base 354. Each of the projection members 351 to 353 has the shape of a generally flat plate, the same width as the superconductor thin film 32, and a thickness of 1 μm. The plurality of projection members 351 to 353 are secured to the base 354 at a spacing of 2 μm so as to be substantially perpendicular to the base 354.

The base 354 has the shape of a generally flat plate and is a member to which the plurality of projection members 351 to 353 are secured. The base 354 is in contact with an end of the screw 34 and, as a result of clockwise rotation of the screw 34, presses the projection members 351 to 353 onto the superconductor thin film 32.

In the Josephson device 40, the screw 34 is rotated clockwise so that the projection members 351 to 353 of the pressing member 35 each apply a pressure of 100 gram-weight to the superconductor thin film 32. As a result, a pressure of the critical pressure $P_{MI}$ (=5.3 GPa) or more is applied to the superconductor thin film 32.

As a result, the superconductor thin film 32 is divided into superconducting layers 321, 323 and an insulating layer 322. Thus, the Josephson device 40 composed of the superconducting layers 321, 323 and the insulating layer 322 is produced.

In this way, by applying a pressure of the critical pressure $P_{MI}$ (=5.3 GPa) or more to a portion of the superconductor thin film 32 with the pressing member 35, the insulating layer 322 is formed in the portion of the superconductor thin film 32.

Thus, a Josephson device can be produced with the superconductor thin film 32 composed of one material ($CuRh_2S_4$).

A Josephson device can be produced by controlling pressure applied to the superconductor thin film 32 while the temperature of the superconductor thin film 32 is kept constant.

By producing a Josephson device with the superconductor thin film 32 composed of one material ($CuRh_2S_4$), characteristics of the Josephson device 40 can be altered. Specifically, by changing pressure applied to the superconductor thin film 32, characteristics of the Josephson device 40 can be altered. Such a property is not found in a Josephson device produced with different materials.

Alternatively, the Josephson device 40 may have a single projection member. The Josephson device 40 may be configured to press the pressing member 35 onto the superconductor thin film 32 with a piezoelectric element or an electrostrictive element instead of the screw 34.

Figure 5:
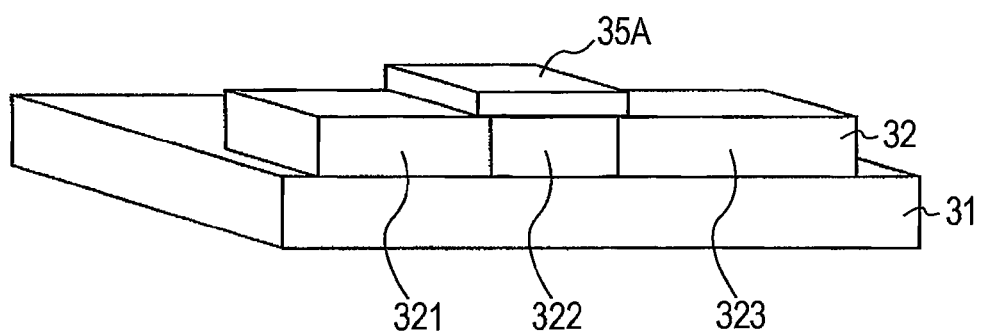
FIG. 5 is a schematic diagram of the configuration of another Josephson device according to an embodiment of the present invention.

FIG. 5 is a schematic diagram of the configuration of another Josephson device according to an embodiment of the present invention. A Josephson device according to an embodiment of the present invention may be a Josephson device 40A shown in FIG. 5.

Referring to FIG. 5, the Josephson device 40A is the same as the Josephson device 40 shown in FIG. 4 except that the support member 33 and the screw 34 are removed and the pressing member 35 is replaced with a piezoelectric element 35A.

The piezoelectric element 35A is disposed on the superconductor thin film 32 so as to be bonded to the superconductor thin film 32. The piezoelectric element 35A presses the superconductor thin film 32 in the thickness direction as a result of application of a voltage to the piezoelectric element 35A by a voltage source (not shown).

As a result, the superconductor thin film 32 is divided into superconducting layers 321, 323 and an insulating layer 322. Thus, the Josephson device 40A is produced.

Alternatively, the Josephson device 40A may include an electrostrictive element instead of the piezoelectric element 35A.

Figure 6:
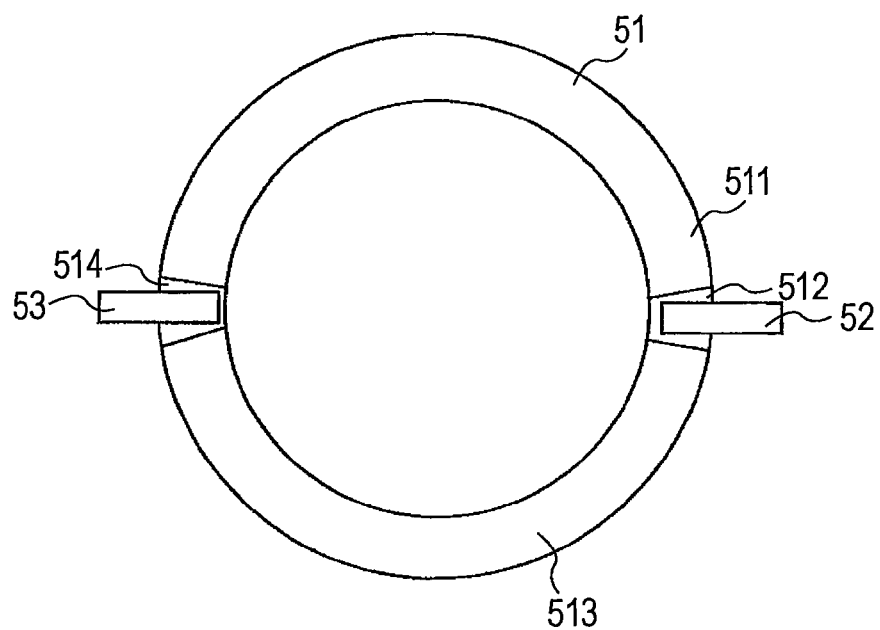
FIG. 6 is a schematic diagram of the configuration of a superconducting quantum interference device according to an embodiment of the present invention.

FIG. 6 is a schematic diagram of the configuration of a superconducting quantum interference device according to an embodiment of the present invention. Referring to FIG. 6, a superconducting quantum interference device 50 according to an embodiment of the present invention includes a superconductor thin film 51 and pressing members 52 and 53.

The superconductor thin film 51 is cooled to an absolute temperature of 10 K or less with liquid nitrogen or the like.

The superconductor thin film 51 is composed of $CuRh_2S_4$ and has the shape of a ring. Each of the pressing members 52 and 53 has the same configuration as that of the pressing member 35 shown in FIG. 4.

The pressing member 52 applies a pressure of the critical pressure $P_{MI}$ (=5.3 GPa) or more to a portion of the superconductor thin film 51. The pressing member 53 applies a pressure of the critical pressure $P_{MI}$ (=5.3 GPa) or more to another portion of the superconductor thin film 51.

As a result, the superconductor thin film 51 is divided into superconducting layers 511, 513 and insulating layers 512, 514. Thus, the superconducting quantum interference device 50 is produced.

In this way, by applying a pressure of the critical pressure $P_{MI}$ (=5.3 GPa) or more to portions of the superconductor thin film 51 with the pressing members 52 and 53, the insulating layers 512 and 514 are formed in the portions of the superconductor thin film 51.

Thus, a superconducting quantum interference device can be produced with the superconductor thin film 51 composed of one material ($CuRh_2S_4$).

A superconducting quantum interference device can be produced by controlling pressure applied to the superconductor thin film 51 while the temperature of the superconductor thin film 51 is kept constant.

Alternatively, in the superconducting quantum interference device 50, the pressing members 52 and 53 (=the pressing member 35) may have a single projection member. The superconducting quantum interference device 50 may be configured to press the pressing members 52 and 53 onto the superconductor thin film 51 with a piezoelectric element or an electrostrictive element instead of the screw 34. In the superconducting quantum interference device 50, the insulating layers 512 and 514 may be formed with the piezoelectric element 35A (or an electrostrictive element).

As described above, the pressure detection apparatus 30, the Josephson devices 40 and 40A, and the superconducting quantum interference device 50 employ the characteristic in which a superconductor thin film (=$CuRh_2S_4$) undergoes a transition from a superconductor to an insulator under the application of a pressure of the critical pressure $P_{MI}$ or more while the temperature of the superconductor is kept constant.

The embodiments that have been disclosed are examples in all respects and should not be understood as being restrictive. The scope of the present invention is defined not by the above-described embodiments but by claims. The scope of the present invention is intended to embrace all modifications equivalent to the claims and within the scope.

INDUSTRIAL APPLICABILITY

The present invention is applied to a pressure detection apparatus employing superconductors that undergo a transition from the superconductors to insulators while the temperature of the superconductors is kept constant. The present invention is also applied to a Josephson device employing a superconductor that undergoes a transition from the superconductor to an insulator while the temperature of the superconductor is kept constant. The present invention is also applied to a superconducting quantum interference device employing a superconductor that undergoes a transition from the superconductor to an insulator while the temperature of the superconductor is kept constant.

The invention claimed is:

1. A pressure detection apparatus comprising:
    a housing configured to maintain at an absolute temperature of 10 Kelvin or less;
    a plurality of superconductor thin films disposed in the housing and having different critical pressures at which a transition from a superconductor to an insulator occurs; and
    a detection device configured to detect, among the plurality of superconductor thin films, a superconductor thin film transiting from the superconductor to the insulator, and detecting, as an internal pressure of the housing, a maximum critical pressure in the critical pressure of the detected superconductor thin film.

2. The pressure detection apparatus according to claim 1 further comprising:
    a plurality of first electrodes disposed so as to be associated with the plurality of superconductor thin films and connected to one ends of the associated superconductor thin films; and
    a plurality of second electrodes disposed so as to be associated with the plurality of superconductor thin films and connected to another ends of the associated superconductor thin films,
    wherein the detection device is configured to detect, among the plurality of superconductor thin films, a superconductor thin film transiting from the superconductor to the insulator by detecting current flowing between the first and second electrodes disposed at the both ends of the superconductor thin films.

3. The pressure detection apparatus according to claim 1, wherein the plurality of superconductor thin films are composed of a plurality of $CuIr_2S_4$ that contain a dopant in different amounts.

4. A Josephson device comprising:
    a superconductor thin film kept at an absolute temperature of 10 K or less and composed of $CuRh_2S_4$; and a pressure application unit configured to apply a pressure of a critical pressure at which a transition from a superconductor to an insulator occurs or more to a portion of the superconductor thin film, and wherein the pressure application unit includes a pressing member configured to press a projection member onto the portion of the superconductor thin film.

5. The Josephson device according to claim 4, wherein the pressure application unit includes a plurality of projection members; and wherein the pressing member is configured to press the plurality of projection members onto the portion of the superconductor thin film.

6. The Josephson device according to claim 5, wherein the pressing member includes an electrostrictive element or a piezoelectric element.

7. The Josephson device according to claim 5, wherein the pressure application unit includes an electrostrictive element disposed so as to be in contact with the portion of the superconductor thin film.

8. A superconducting quantum interference device comprising:

a superconductor thin film having a shape of a ring, and including $CuRh_2S_4$ kept at an absolute temperature of 10 K or less;

a first pressure application unit configured to apply a pressure of a critical pressure at which a transition from a superconductor to an insulator occurs or more to a first portion of the superconductor thin film; and a second pressure application unit configured to apply a pressure of the critical pressure or more to a second portion of the superconductor thin film, the second portion being different from the first portion.

9. The superconducting quantum interference device according to claim 8, wherein each of the first and second pressure application units includes:

a plurality of projection members; and a pressing member configured to press the plurality of projection members onto the portion of the superconductor thin film.

* * * * *

UNITED STATES PATENT AND TRADEMARK OFFICE
CERTIFICATE OF CORRECTION

| | | |
|---|---|---|
| PATENT NO. | : 8,338,821 B2 | Page 1 of 1 |
| APPLICATION NO. | : 12/601790 | |
| DATED | : December 25, 2012 | |
| INVENTOR(S) | : Suzuki | |

It is certified that error appears in the above-identified patent and that said Letters Patent is hereby corrected as shown below:

In Column 10, Line 1, in Claim 8, delete "haying" and insert -- having --, therefor.

Signed and Sealed this
Fifth Day of March, 2013

Teresa Stanek Rea
*Acting Director of the United States Patent and Trademark Office*